United States Patent
Boys

(10) Patent No.: US 9,886,533 B2
(45) Date of Patent: *Feb. 6, 2018

(54) DYNAMIC SIMULATION OF FLUID FILLED VESSELS

(71) Applicant: Invensys Systems Inc., Foxboro, MA (US)

(72) Inventor: Ian H. Boys, Vista, CA (US)

(73) Assignee: Schneider Electric Software, LLC, Lake Forest, CA (US)

( * ) Notice: Subject to any disclaimer, the term of this patent is extended or adjusted under 35 U.S.C. 154(b) by 93 days.

This patent is subject to a terminal disclaimer.

(21) Appl. No.: 14/792,145

(22) Filed: Jul. 6, 2015

(65) Prior Publication Data

US 2015/0310147 A1    Oct. 29, 2015

Related U.S. Application Data

(63) Continuation of application No. 14/067,625, filed on Oct. 30, 2013, now Pat. No. 9,075,942, which is a continuation of application No. 13/081,496, filed on Apr. 7, 2011, now Pat. No. 8,615,387.

(51) Int. Cl.
*G06F 17/10* (2006.01)
*G06F 17/50* (2006.01)

(52) U.S. Cl.
CPC .......... *G06F 17/5009* (2013.01); *G06F 17/10* (2013.01)

(58) Field of Classification Search
CPC .............................. G06F 17/5009; G06F 17/10
USPC ............................................................. 703/2
See application file for complete search history.

(56) References Cited

U.S. PATENT DOCUMENTS

| | | | | |
|---|---|---|---|---|
| 5,551,282 A | * | 9/1996 | Vander Heyden | .... G01F 15/046 374/36 |
| 5,732,192 A | * | 3/1998 | Malin | ................. G06F 17/5036 703/2 |
| 6,041,263 A | * | 3/2000 | Boston | ................... G05B 17/02 700/1 |

(Continued)

OTHER PUBLICATIONS

Bill Key ("Liquid/Gas Equilibrium Thermodynamics—An Explanation for Practicing Engineers", Society of Petroleum Engineers, 1992, pp. 1-43).*

(Continued)

*Primary Examiner* — Omar Fernandez Rivas
*Assistant Examiner* — Iftekhar Khan
(74) *Attorney, Agent, or Firm* — Stephen Manetta; Daniel Sheridan

(57) ABSTRACT

A system is provided. The system comprises a computer system comprising at least one processor, a thermodynamic state solver application, and a thermodynamic system solver application. When executed by the at least one processor, the thermodynamic state solver application computes a flash equilibrium state solution for each of a plurality of nodes in a thermodynamic network and determines for each of the plurality of nodes at least one sensitivity of a first thermodynamic property with reference to at least one second thermodynamic property. When executed by the at least one processor, the thermodynamic system solver computes a pressure at each of the nodes and flows between the nodes based at least in part on the sensitivities, wherein a result based on the pressures and flows is determined.

17 Claims, 4 Drawing Sheets

(56) References Cited

U.S. PATENT DOCUMENTS

| | | | | |
|---|---|---|---|---|
| 6,065,328 | A * | 5/2000 | Dayton | G01F 1/66 700/266 |
| 6,209,387 | B1 * | 4/2001 | Savidge | G01F 1/66 73/23.29 |
| 6,560,514 | B1 * | 5/2003 | Schultz | G05B 13/024 700/209 |
| 6,732,570 | B2 * | 5/2004 | Francisco, Jr. | G01F 1/8468 73/32 A |
| 6,748,349 | B1 * | 6/2004 | Majumdar | G05B 17/02 703/2 |
| 6,862,562 | B1 * | 3/2005 | Chen | G05B 17/02 700/28 |
| 7,516,655 | B2 * | 4/2009 | DiFoggio | E21B 49/10 73/152.58 |
| 7,542,885 | B1 * | 6/2009 | Majumdar | G06F 17/5018 700/83 |
| 7,580,821 | B2 * | 8/2009 | Schirm | G06F 17/5009 345/473 |
| 7,676,352 | B1 * | 3/2010 | Van Peursem | G05B 17/02 137/828 |
| 8,165,860 | B2 * | 4/2012 | Xu | G05B 17/02 703/12 |
| 9,261,869 | B2 * | 2/2016 | Cheng | G05B 17/02 |
| 2002/0177986 | A1 * | 11/2002 | Moeckel | G06F 17/50 703/7 |
| 2008/0295607 | A1 * | 12/2008 | Di Maggio | G01N 33/2823 73/861.04 |

OTHER PUBLICATIONS

Kim et al. ("Inverse estimation of thermophysical properties for anisotropic composite", Elsevier Science Inc, 2003, pp. 697-704).*

Alok Majumdar ("Numerical Modeling of Conjugate Heat Transfer in Fluid Network", Jet Propulsion Laboratory, Pasadena, 2004).*

Mathias et al., ("Effective Utilization of Equations of State for Thermodynamic Properties in Process Simulation", AlChE Journal, Mar. 1984, pp. 182-186).*

* cited by examiner

US 9,886,533 B2

DYNAMIC SIMULATION OF FLUID FILLED VESSELS

CROSS-REFERENCE TO RELATED APPLICATIONS

This application is a continuation of and claims priority to U.S. patent application Ser. No. 14/067,625, filed Oct. 30, 2013, which is a continuation of and claims priority to U.S. patent application Ser. No. 13/081,496, filed Apr. 7, 2011, the contents of which are incorporated herein by reference in their entirety for all purposes.

STATEMENT REGARDING FEDERALLY SPONSORED RESEARCH OR DEVELOPMENT

Not applicable.

REFERENCE TO A MICROFICHE APPENDIX

Not applicable.

BACKGROUND

In the drive for ongoing improvements in operating efficiency, industrial plants such as chemical plants, refineries, food processing plants, pharmaceutical plants, breweries, and other batch and continuous plant systems may employ computer-based modeling and simulation of thermodynamic network systems to optimize plant operations. These modeling systems are typically used to simulate plant processes by defining components and equipment of plants in computer models and then using mathematical computations to project and/or to reveal the behavior of these systems as relevant parameters vary. An example of a thermodynamic network system is a pressure flow network comprising a plurality of nodes such as, for example, vessels, tanks, mixers and splitters, etc., and a plurality of flow components such as, for example, control valves, heat exchangers, etc.

This type of modeling may be used to aid in the design and operation of such plants, as well as to provide computer-based training of operators by simulating plant and process responses to variations that can arise in real-world situations without the hazards or costs associated with subjecting plants to these events. In addition, predictions can be made about plant behavior in order to devise tactics for handling such events, should they occur. This type of modeling can also be used to assist in controlling plant operations by predicting system changes and responding accordingly by tying the information produced by the models into control loops of plant equipment. Another use for this type of modeling is the optimization of tuning of process control elements in response to a system perturbation.

SUMMARY

In an embodiment, a system is disclosed. The system comprises a computer system comprising at least one processor, a thermodynamic state solver application, and a thermodynamic system solver application. When executed by the at least one processor, the thermodynamic state solver application computes a flash equilibrium state solution for each of a plurality of nodes in a thermodynamic network and determines for each of the plurality of nodes at least one sensitivity of a first thermodynamic property with reference to at least one second thermodynamic property. When executed by the at least one processor, the thermodynamic system solver computes a pressure at each of the nodes and flows between the nodes based at least in part on the sensitivities, wherein a result based on the pressures and flows is determined.

In an embodiment, a system is disclosed. The system comprises a computer system comprising at least one processor and a thermodynamic process simulator application that executes for the duration of a time period, the time period comprising a plurality of time steps. When executed on the at least one processor, the thermodynamic process simulator iteratively invokes a pressure flow solver application to determine for each time step a plurality of pressures and flows for a thermodynamic network comprising a plurality of nodes. The thermodynamic process simulator also invokes a flash solver application for each of the plurality of nodes, the flash solver application performing a flash equilibrium calculation to obtain in part at least one sensitivity associated with a first thermodynamic variable and performing for each of the plurality of nodes a Taylor series expansion of a thermodynamic property associated with the first thermodynamic variable, wherein the expansion is based on the at least one sensitivity, to produce at least one residual, wherein a result is determined.

In an embodiment, a computer program product for a thermodynamic modeling system is provided. The computer program product comprises a computer readable storage medium having computer usable program code embodied therein wherein the computer usable program code implements a thermodynamic state solver application and a thermodynamic system solver application. The thermodynamic state solver application, when executed by at least one processor, computes a flash equilibrium state solution for each of a plurality of nodes in a thermodynamic network and determines for each of the plurality of nodes at least one sensitivity of a first thermodynamic property with reference to at least one second thermodynamic property. The thermodynamic system solver application, when executed by the at least one processor, computes a pressure at each of the nodes and flows between the nodes based at least in part on the sensitivities. The computer program product further determines a result based on the pressures and flows.

These and other features will be more clearly understood from the following detailed description, taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
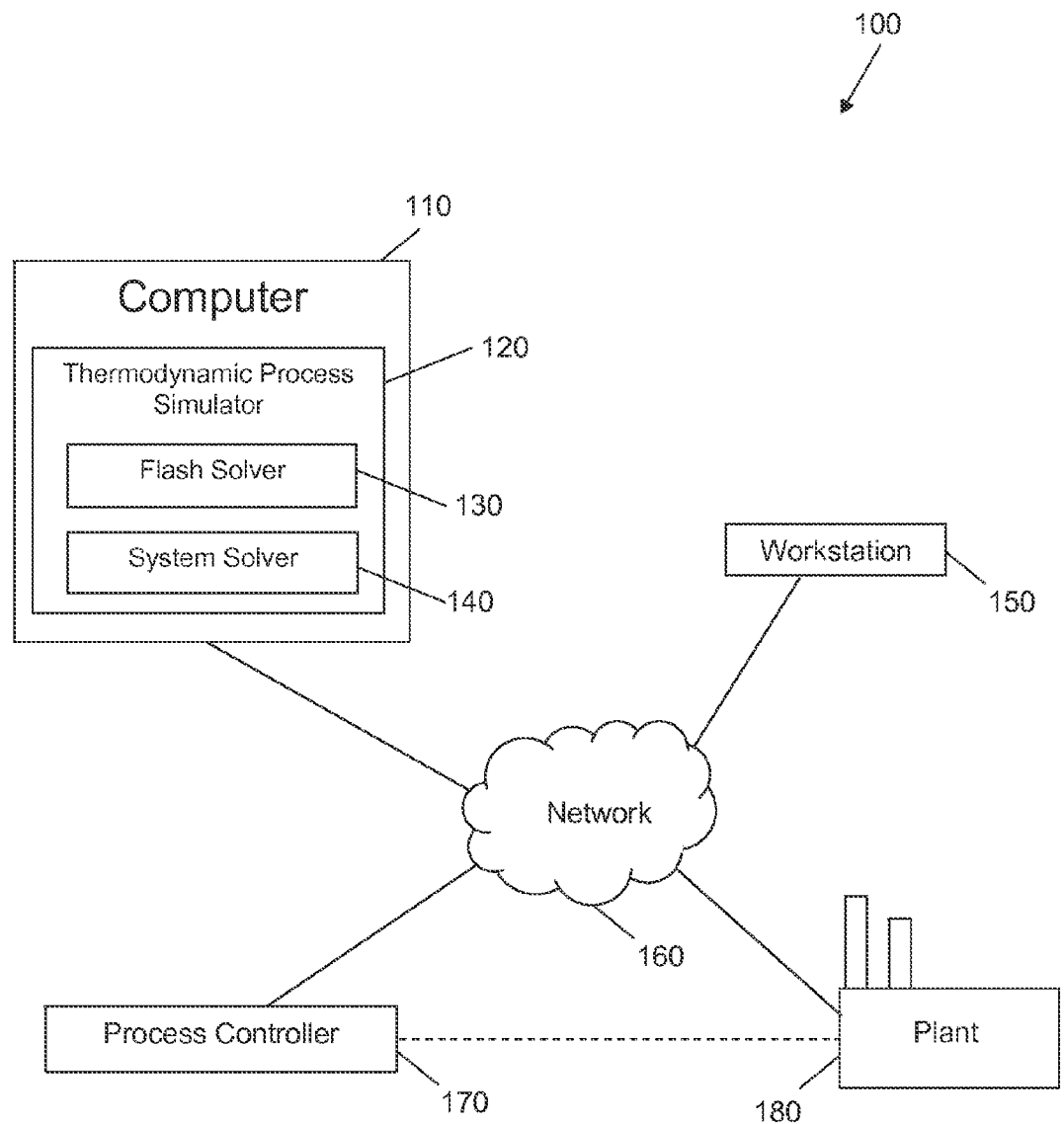
FIG. 1 illustrates a system suitable for implementing several embodiments of the disclosure.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

Computer-based modeling of thermodynamic network systems typically involves iterative calculations of complex thermodynamic equations in order to accurately describe quasi-static views of dynamic situations. Given the rapidly changing state of these systems and the limitation of only being able to calculate thermodynamic states at discrete moments in time, this form of modeling can place heavy demands on a computer's central processing unit (CPU) as constant updating is needed to keep the model updated. This heavy processing load challenges the ability to provide accurate data with sufficient speed to obtain predictive models in time to proactively forestall critical situations, thereby rendering plant control in a real world application difficult or impossible.

In some known thermodynamic modeling and/or simulation of thermodynamic network systems, the algorithms may not be robust against numerical failure and may not converge to a thermodynamic state solution, causing the algorithm to fail. In other circumstances, the known algorithms may converge to a thermodynamic state solution, however the convergence may either be too slow to permit use in real-time applications or the solution may not achieve a desired degree of accuracy. The present disclosure teaches a system and method for modeling, simulating and controlling thermodynamic network systems to determine a fast, accurate and robust thermodynamic state solution. The method can be performed by a computer system comprising at least one processor to calculate and thereby simulate and/or model the characteristics of a thermodynamic network.

A thermodynamic network may comprise a plurality of nodes that may be coupled to each other via a plurality of flow components. Henceforth, the terms 'node' and 'vessel' might be used synonymously in this document, however it is understood that the method disclosed herein may be applied to different thermodynamic systems. Each flow component may have a directionality indicated by an "upstream" and a "downstream" end. Each end may be connected to a node. Two nodes cannot be coupled to each other directly; coupling may be done via a flow component. Two flow components cannot be coupled to each other directly; coupling may be done via a node. Each end of a flow may be connected to one node only. Examples of nodes may comprise, for example, vessels, tanks, mixers and splitters, etc., and examples of flow components may comprise, for example control valves, heat exchangers, etc.

The disclosure teaches a system and method for determining an accurate thermodynamic state solution for a thermodynamic network via a numerically robust and fast algorithm. The method comprises an algorithm that computes a plurality of sensitivities associated with the nodes in the thermodynamic network to efficiently estimate the state of the thermodynamic system. The method comprises a thermodynamic process simulation invoking a flash solver application for each node to compute a flash solution associated with the subject node and to obtain at least one sensitivity associated with the node, for example a sensitivity of a first thermodynamic property to change in a second thermodynamic property evaluated at the flash solution point.

The method further comprises the simulation invoking a system solver application to iteratively compute the thermodynamic state solution of the thermodynamic system based at least in part on the sensitivities associated with the nodes. The system solver application tests a series of trial solutions by changing calculated pressures and calculated flows and calculating an error associated with the trial solution. When the error of the trial solution is less than a threshold error, the trial solution is deemed the thermodynamic state solution. The system solver application adapts the values of the flash solutions based on the sensitivities and based on a variance of the pressure and flows from the values used by the flash solver application when calculating the sensitivities. The system solver then uses these adapted values for calculating the error of the trial solution. The adapted values comprise an approximation of what the flash solutions would be if recalculated. While not as accurate as would be provided by full recalculation of the flash solutions, the adapted values can be determined more rapidly than recalculating the flash solution of each of the nodes during each iteration of the system solver application. Stated another way, using the adapted values that depend on the changes in pressure and flow values provides improved performance versus using constant values that do not depend on the changes in pressure and flow values. The use of the adapted values by the system solver application promotes more rapid convergence of the thermodynamic system equation solution.

FIG. 1 illustrates a system 100 suitable for generating models that simulate and control the physical characteristics of a thermodynamic system according to the embodiments of the disclosure. A computer 110 includes a memory that stores and a processor that invokes a thermodynamic process simulation application 120, a flash solver application 130 and a system solver application 140. The thermodynamic process simulation application 120, the flash solver application 130 and the system solver application 140 together implement a thermodynamic model that may be used, for example, to control a thermodynamic process in a plant, train an operator of the thermodynamic process or the plant, to predict a future behavior of the thermodynamic process, to optimize the tuning of process control elements, and to validate a design of a thermodynamic process component, a thermodynamic process control component, and/or a thermodynamic process. In a similar manner, the thermodynamic model may be used to control a chemical process control component, to train an operator of the chemical process control component, to predict a failure time of the chemical process control component, to optimize the tuning of process control elements, and to validate a design for the chemical process control component.

In an embodiment, by modeling thermodynamic processes to determine a result, such as a flash condition, the computer 110 may control the thermodynamic process in a plant 180. The flash condition may be considered in association with a thermodynamic component, for example, but not by way of limitation, a stripper column, a distillation column, an extractor column, an absorber column, and a compressor. In an embodiment, the result also may comprise a flash condition in a flash evaporator, a distillation condition in a distillation column, an absorption condition in an absorber column, and/or a stripping condition in a stripper column. In another embodiment, by modeling thermodynamic processes, possibly faster than the corresponding processes occur in real-time, to predict a future state of the thermodynamic process, the computer 110 may anticipate an undesirable and/or hazardous operating condition before it occurs and take corrective action automatically and/or notify an operator to take corrective action. Corrective actions may comprise adjusting one or more operating parameters, for example a material mixture input stream flow rate associated with the thermodynamic process. Corrective actions may comprise shutting down one or more motors and/or heaters coupled to the thermodynamic process.

By modeling thermodynamic processes, the computer 110 may forecast operating conditions of the thermodynamic process one minute, five minutes, ten minutes, or further ahead, based on current process parameters and control inputs. In an embodiment, the thermodynamic process modeling and/or simulation, executed by the computer 110, may forecast the future failure of a thermodynamic process component and/or a thermodynamic process control component, allowing a replacement to be ordered and replacement activities to be scheduled, for example at a time which does not interrupt an in-progress batch process, thereby averting costs associated with wasted materials. In an embodiment, by modeling thermodynamic processes the computer 110 may calculate and optimize the fine tuning of process control elements, for instance, in response to perturbations in the system, enabling an adaptive behavior of the system to both steady state and transient conditions.

In an embodiment, the computer 110 may receive measurements of thermodynamic variables from the plant 180 via a network 160, for example from sensors coupled to thermodynamic components in the plant 180 such as chambers of a fractionation tower and/or a distillation tower. Sensors of thermodynamic variables may include temperature sensors, pressure sensors, and the like.

The network 160 may be provided by any of a local area network, a public switched telephone network (PSTN), a public data network (PDN), and a combination thereof. Portions of the network 160 may be provided by wired connections while other portions of the network 160 may be provided by wireless connections. Based on the values of the thermodynamic variables, the computer 110 may invoke the thermodynamic process simulation application 120 to determine control and/or command values. The computer 110 may then transmit the control and/or command values via the network 160 to a process controller 170, where the process controller 170 is coupled to the plant 180 and/or a thermodynamic process component in the plant 180 via network 160. The process controller 170 may control the plant 180 and/or one or more thermodynamic process components in the plant 180 based on the control and/or command values received from the computer 110.

The system 100 may further comprise a workstation 150 that may provide a user interface for an operator to interact with the computer 110 and/or the thermodynamic process simulation application 120. In an embodiment, a trainee may use the workstation 150, in association with the computer 110 and the thermodynamic process simulation application 120, to simulate a variety of virtual events associated with the plant 180, for example a motor tripping off line, and the result of the trainee's response to the virtual event in the simulated behavior of the plant 180. This may permit trainees to learn valuable plant management lessons in a safe and consequence-free environment. In an embodiment, a manager of the plant 180 may use the workstation 150 to model the operation of a variety of thermodynamic process components of the plant 180 at different operating points, to analyze advantages and disadvantages associated with operating the plant 180 at these operating points. For example, an increased material throughput may be associated with higher operating costs per unit of product output, but in market conditions of elevated prices for the product, greater profit may nevertheless result from the increased throughput.

The thermodynamic process simulation application 120, the flash solver application 130 and the system solver application 140 may be stored in the memory of the computer 110. Computers are discussed in more detail hereinafter. In an embodiment, other thermodynamic applications may be stored in the memory of the computer 110 and executed by the processor of the computer 110. Alternatively, in an embodiment, the thermodynamic process simulation application 120, the flash solver application 130 and the system solver application 140 may be may be stored in a memory of the workstation 150 and/or executed by the workstation 150. Alternatively or additionally, the thermodynamic process simulation application 120, the flash solver application 130 and the system solver application 140 may be stored on one or more computer readable media, for example floppy disks, compact disks, optical disks, magnetic tapes, magnetic disks, and other computer readable storage media.

In an embodiment, the thermodynamic process simulation application 120 and/or the flash solver application 130 and/or the system solver application 140 may be copied and/or loaded from the computer readable media to the computer 110, for example to a secondary storage of the computer 110, to a non-volatile memory of the computer 110, or to a volatile memory of the computer 110. In an embodiment, the thermodynamic process simulation application 120 and/or the flash solver application 130 and/or the system solver application 140 may be executed by a processor of the computer 110 reading the instructions implementing the thermodynamic process simulation application 120 and/or the flash solver application 130 and/or the system solver application 140 from the computer readable media, from secondary storage, from non-volatile memory, and/or from volatile memory. In an embodiment, the instructions or a portion of the instructions implementing the thermodynamic process simulation application 120 and/or the flash solver application 130 and/or the system solver application 140 may be transmitted to the computer 110 from the network 160, via either a wired and/or a wireless communication link.

The computer 110 may invoke the thermodynamic process simulation application 120. The thermodynamic process simulation application 120 may determine at least one primary thermodynamic variable and at least one secondary thermodynamic variable. The thermodynamic process simulation application 120 may then invoke the flash solver application 130 and the system solver application 140 to determine a thermodynamic result. The thermodynamic process simulation application 120 may invoke the flash solver application 130 and the system solver application 140 with a variety of specified values, while the thermodynamic process simulation application 120 is in the process of iteratively converging on a consistent solution of thermodynamic state for a thermodynamic system, volume, and/or process. In an embodiment, it may be desirable that the result returned by the flash solver application 130 and the system solver application 140 promote convergence of the solution sought by the thermodynamic process simulation application 120. In some circumstances, a solution may be deemed to have been arrived at when an error calculated based on the solution is less than a predetermined error threshold.

In an embodiment, the thermodynamic process simulation application 120 may invoke a flash solver application 130 for each node to determine at least one sensitivity per node, for example a sensitivity of a first thermodynamic property to changes in second thermodynamic property. In an embodiment, the at least one sensitivity may comprise at least one partial derivative of a specified primary thermodynamic variable with respect to a specified secondary thermodynamic variable. The thermodynamic process simulation application 120 may then invoke the system solver application 140 to iteratively determine the thermodynamic state solution based on the sensitivities.

Figure 2:
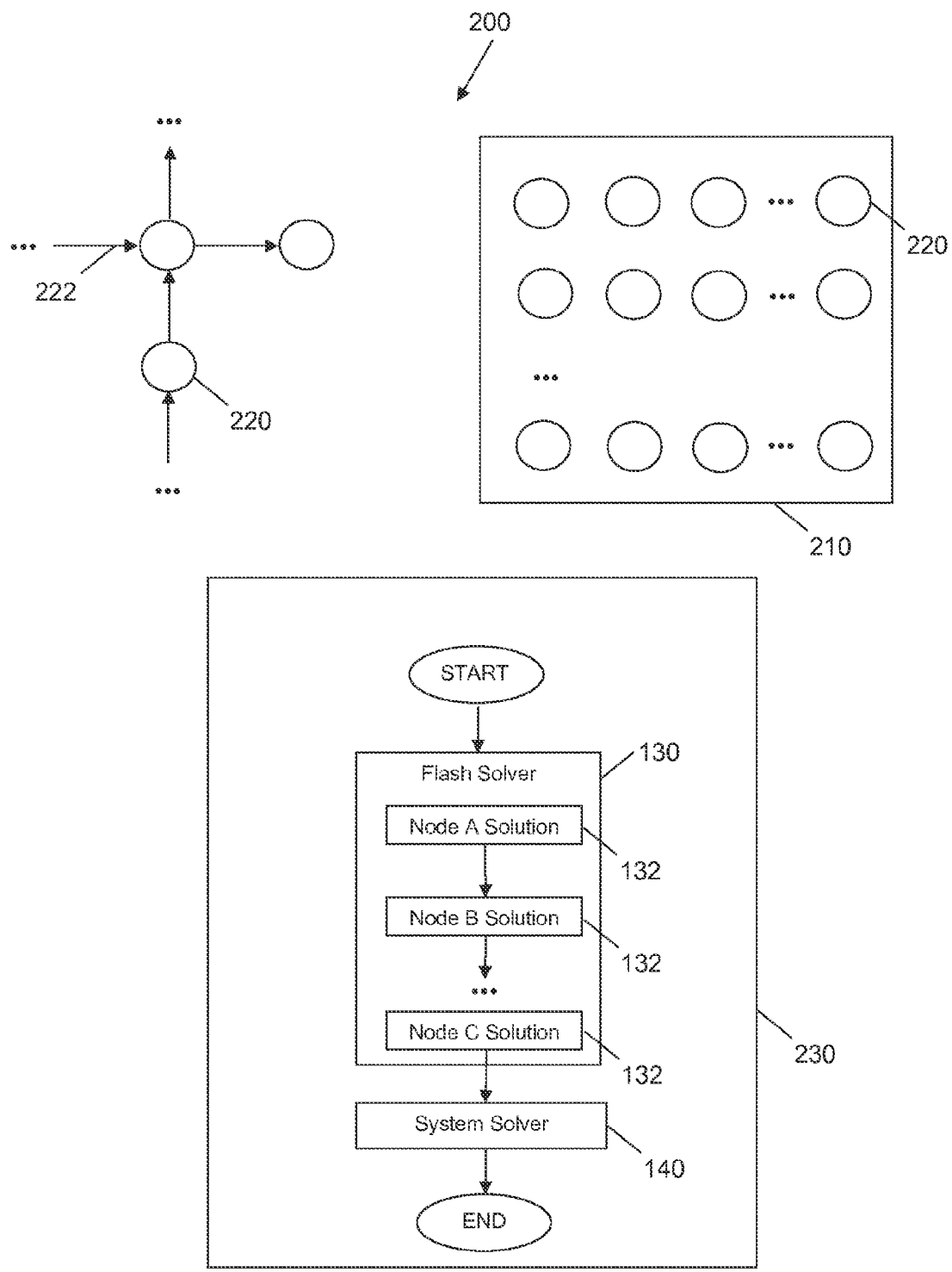
FIG. 2 illustrates one embodiment of a thermodynamic network and a thermodynamic network simulation system

FIG. 2 abstractly illustrates one embodiment of a thermodynamic network, one embodiment of a node/flow components structure and one embodiment of a thermodynamic network simulation system 200. The thermodynamic network 210 may comprise a plurality of nodes 220 that may be coupled to each other via a plurality of flow components 222. For the sake of clarity, not all nodes 220 and not all flow components 222 are explicitly labeled in the drawing. The nodes 220 may not be directly connected to each other but may be connected to each other via flow components 222. The flow components 222 may have an "upstream" and a "downstream" end, wherein each end may be connected to a node 220. By convention, the direction of the flow in the flow components 222 is indicated by arrows pointing towards the "downstream" end. A node 220 may be connected to a plurality of flow components 222.

The thermodynamic process simulation application 120 may execute for the duration of a specified time period, wherein the time period is divided into a plurality of time steps. In an embodiment, the duration of all the time steps is equal. In another embodiment, however, the time steps may not be all equal and the duration of time step may adapt over time. For example, the time step may be adapted based on a desired system solution accuracy, based on a processor idle time, or based on other considerations. In an embodiment, the time step may be adapted based on a number of iterations of a system solver application needed to achieve a system solution meeting a maximum error criteria. During operating modes when relatively few iterations of the system solver application are needed to achieve a system solution, the time step may be increased in duration, while during operating modes when relatively many iterations of the system solver application are needed to achieve a system solution, the time step may be reduced in duration.

The thermodynamic process simulation application 120 may model the behavior of the thermodynamic network 210 by invoking a state solver application 230 at the beginning of each time step to compute the thermodynamic state solution of the thermodynamic network 210. In an embodiment, the thermodynamic process simulation application 120 may comprise a sequential portion and a parallel portion. In the sequential portion, the equations involving component mole and energy balances may be solved for each node separately, in a sequential fashion. This sequential process is suggested by the node solutions 132 in FIG. 2. It is understood that the node solutions 132 may be calculated for each different node in the thermodynamic network 210 in turn by the flash solver application 130. In the parallel portion, other equations are solved simultaneously for all nodes and flow components comprised in the network 210, for example by the system solver application 140. In an embodiment, solving simultaneously may comprise solving a system of z equations comprising z unknown variables. In a further embodiment, the z equations comprising z unknown variables may be solved by inverting a matrix. In an embodiment, the thermodynamic process simulation application 120 may model a pressure flow network, wherein the sequential portion may comprise the calculation of a flash solution for each node, and the parallel portion may comprise solving a plurality of equations associated with a plurality of unknown pressures and unknown flows.

In an embodiment, at the beginning of each time step, the thermodynamic process simulation application 120 may perform a flash calculation for each node and then iteratively solve a plurality of pressure and flow equations that model the behavior of the thermodynamic network 210, wherein at each iteration the thermodynamic process simulation application 120 may determine at least one residual and wherein, based on the value of the residual, the thermodynamic process simulation application 120 may continue to the next iteration or to the next time step. In some embodiments, the residual may indicate an error term, and the thermodynamic process simulation application 120 may compare the magnitude of the error term to a stopping criterion.

In an embodiment, the state solver application 230 may invoke the flash solver application 130 to solve an equation of state for each node in the thermodynamic network 210 to obtain a flash equilibrium solution and to determine at least one sensitivity associated with each node. The state solver application 230 may then forward a plurality of results comprising the sensitivities to the system solver application 140, and the system solver application 140 may iteratively determine the thermodynamic state solution for the current time step. In an embodiment, each iteration of the system solver application 140 may compute a residual for each node, wherein the residual is associated with the primary thermodynamic variable and wherein the residual is based on at least one sensitivity associated with the node, and compare the residuals to a stopping criterion. One skilled in the art combined with the teachings in the present disclosure may readily determine a suitable stopping criterion based on constraints comprising computer speed, desired accuracy etc. For example, in an embodiment, a stopping criterion may comprise a specified threshold value for the sum of the residuals. In another embodiment, a stopping criterion may comprise an adaptive threshold. Different embodiments of stopping criteria may be preferred, and it is contemplated that the teachings of the present disclosure may be applied to these different stopping criteria.

In an embodiment, the flash solver application 130 may determine a plurality of thermodynamic properties associated with the subject node based on an equation of state, wherein the equation of state may comprise at least one specified independent thermodynamic variable. The at least one specified independent thermodynamic variable associated with the subject node may comprise, for example, a specified volume V, a specified internal energy U, a specified pressure P, a specified molar flow F, a specified enthalpy H, a specified heat flow Q, a specified temperature T, a specified molar volume v, a specified vapor mole fraction $\alpha$, a specified second liquid mole fraction $\beta$, a damping factor $\lambda$, and a fugacity coefficient $\varphi$.

The at least one specified independent thermodynamic variable associated with the subject node based may further comprise a composition $\bar{n}=\{n_1, n_2, \ldots, n_M\}$, a rate of change of moles due to a reaction $\bar{r}=\{r_1, r_2, \ldots, r_M\}$, a mole fraction in liquid or mixed phase $\bar{x}=\{x_1, x_2, \ldots, x_M\}$, a mole fraction in vapor phase $\bar{y}=\{y_1, y_2, \ldots, y_M\}$, and a mole fraction in mixed or phase-undifferentiated phase $\bar{z}=\{z_1, z_2, \ldots, z_M\}$, wherein $n_i$ represents the number of moles of the i-th chemical species, also referred to as the i-th chemical composition, $r_i$ represents the changes of moles of the i-th chemical species due to a reaction, $x_i$ represents the mole fraction in liquid phase of the i-th chemical species, $y_i$ represents the mole fraction in vapor phase of the i-th chemical species, $z_i$ represents the mole fraction in mixed phase of the i-th chemical species, wherein the i-th chemical species is comprised in an M-species material mixture and/or composition that is the subject of the thermodynamic analysis with $$\sum_{i=1}^{M} n_i \equiv n,$$

and other thermodynamic variables. For example, a mole quantity of a material mixture, i.e. n=1, comprised of 0.2 mole of methane in the vapor phase, 0.2 mole of ethane in the vapor phase, 0.1 mole of butane in the vapor phase, 0.1 mole of methane in the liquid phase, 0.2 mole of ethane in the liquid phase and 0.2 mole of butane in the liquid phase may be represented as $\bar{z}=\{z_1=03, z_2=0.4, z_3=0.3\}$, $\bar{y}=\{y_1=0.4, y_2=0.4, y_3=0.2\}$, $\bar{x}=\{x_1=0.2, x_2=0.4, x_3=0.4\}$, and vapor mole fraction α=0.5.

Volume V may be represented in units of m³, internal energy U may be represented in units of kJoule/kmole, pressure P may be represented in units of Pascals, molar flow F may be represented in units of kmole/second, enthalpy H may be represented in units of kJoule/kmole, heat flow Q may be represented in units of kJoule/second, temperature T may be represented in units of degrees Kelvin, molar volume v may be represented in units of m³/kmole, composition $\bar{n}$ may be represented in units of kmole, and rate of change $\bar{r}$ may be represented in units of kmole/second. Mole fraction in liquid or mixed phase $\bar{x}$, mole fraction in vapor phase $\bar{y}$, vapor mole fraction α, second liquid mole fraction β, damping factor λ and fugacity coefficient φ may not associated with any units. While the quantity of the subject material may be analyzed based on a reference mole quantity, the actual quantity of the subject material within the thermodynamic process may be a different quantity. While the above units are consistent with the International System of Units (SI), any consistent system of units may be employed. Also mixed systems may be employed with provision for appropriate proportionality constants. In an embodiment, a phase or an assumed phase of the material may also be specified.

In an embodiment, the equation of state solved by the flash solver application 130 may be represented as:

$$EOS(V,U,P,F,H,Q,T,v,\bar{n},\bar{r},\bar{x},\bar{y},\alpha,\beta,\lambda,\varphi,t)=0) \quad (1)$$

wherein t indicates time represented in units of seconds. A number of different equations of state are known to those skilled in the art. Although different equations of state may be preferred for modeling and analyzing different thermodynamic systems, it is contemplated that the teachings of the present disclosure may be applied to these different equations of state.

In an embodiment, the processing of the flash solver application 130 may be based on an equation of state comprising a flash equilibrium calculation or another equation of state derived from a flash equilibrium calculation, but in other embodiments the flash solver application 130 may be based on a different equation of state. Different equations of state may be preferred for modeling and analyzing different thermodynamic systems and different states, and it is contemplated that the teachings of the present disclosure may be applied to these different equations of state and thermodynamic systems and states.

The thermodynamic process simulation application 120 may comprise computations to estimate the value of a primary thermodynamic variable X at a point of interest based on the knowledge of the value of X at a reference point. X may be a function of a plurality of secondary thermodynamic variables $\bar{p} = \{p_1, p_2 \ldots p_D\}$, wherein each $p_i$ is a secondary thermodynamic value, wherein i ranges from 1 to D, and wherein D is an integer indicating the number of secondary variables. An estimate of X at point of interest $\bar{p} = \{p_1, p_2 \ldots p_D\}$ may be generated via reference point $\bar{r} = \{r_1, r_2 \ldots r_D\}$ according to several methods well known to one skilled in the art. In an embodiment, the value of X at point $\bar{p}$ may be estimated via a Taylor series expansion of X around the reference point $\bar{r}$. In an embodiment, the value of X at $\bar{p}$ may be approximated by a linearization scheme. A number of other linearization schemes may be known to those skilled in the art such as, for example, a linearization scheme based on a first order Taylor series by expanding X into a linear series around point $\bar{r}$ in the following way:

$$X = X_0 + \frac{\partial X}{\partial p_1}(p_1 - r_1) + \frac{\partial X}{\partial p_2}(p_2 - r_2) \ldots + \frac{\partial X}{\partial p_D}(p_D - r_D), \quad (2)$$

wherein $X_0$ denotes the variable X evaluated at the reference point $\bar{r}$ and wherein the partial derivatives are all evaluated at the reference point $\bar{r}$. In some contexts, the coefficients of the Taylor series, i.e. the partial derivatives in Eq. (2) evaluated at point $\bar{r}$, may also be referred to as 'sensitivities'. In an embodiment, the flash solver application 130 may compute at least one sensitivity, the at least one sensitivity comprising a partial derivative of the primary thermodynamic variable with respect to a secondary thermodynamic variable, the partial derivative evaluated at the flash equilibrium solution point, also termed the flash solution point in this document. In an embodiment, the flash solver application 130 may perform a flash equilibrium calculation to compute the flash solution point. It is understood that some sensitivities may be more significant than others. Stated in another way, an approximation of the value X may omit consideration of the sensitivities associated with one or more of the secondary variables.

Eq. (2) may further be used as an estimate for $$\frac{dX}{dt},$$

i.e., the temporal derivative indicating the rate of change of X with time. Indicating the duration of a time step by Δt, setting the reference point to the state at the previous time step and the point of interest to the state at the current time step and further using the shorthand notations $X-X_0 \equiv \Delta X$ $p_i - r_i \equiv \Delta p_i$ for all i, we may estimate $$\frac{\Delta X}{\Delta t},$$

i.e., the rate of change X in the current time step as the division of Eq. (1) by Δt $$\frac{dX}{dt} \cong \frac{\Delta X}{\Delta t} = \frac{\partial X}{\partial p_1}\frac{\Delta p_1}{\Delta t} + \frac{\partial X}{\partial p_2}\frac{\Delta p_2}{\Delta t} \ldots + \frac{\partial X}{\partial p_D}\frac{\Delta p_D}{\Delta t}, \quad (3)$$

Estimating $$\frac{dX}{dt}$$

based on a first order Taylor series may lead to a fast and accurate convergence of the thermodynamic state solution since the behavior of the system around the point of interest $\vec{p}$ may be approximated and/or estimated by a computationally simple linear function with only a negligible error due to the approximation and/or estimation.

For example, in an embodiment, the thermodynamic simulation application 120 may specify the volume V as the primary thermodynamic variable and $n_i$, U and P as the secondary thermodynamic variables, wherein the index i ranges form 1 to M. The value of $$\frac{dV}{dt}$$

may be approximated and/or estimated based on a Taylor series expansion around the flash solution point, as shown in Eq. (3), wherein the coefficients of the Taylor series expansion may comprise plurality of sensitivities associated with V, referred to in this document as 'volume sensitivities'. The volume sensitivities may comprise $$\frac{\partial V}{\partial n_i},$$

the partial derivative of the volume with respect to $n_i$, $$\frac{\partial V}{\partial U},$$

the partial derivative of the volume with respect to U, and $$\frac{\partial V}{\partial P},$$

the partial derivative of the volume with respect to P, wherein the index i may range from 1 to the number of chemical species M and wherein the volume sensitivities may be evaluated at the flash solution point. In an embodiment, the sensitivities of volume to changes in the species $n_i$ may be neglected.

The volume sensitivities may have been pre-calculated and stored by the flash solver application 130 before the beginning of the iterations of the system solver application 140. Using the pre-calculated sensitivities as series coefficients in a linear series expansion of $$\frac{dV}{dt}$$

may lead to both a fast and an accurate computation of $$\frac{dV}{dt},$$

the linear series expansion being a significant improvement over estimating $$\frac{dV}{dt}$$

as a constant, the linear series expansion therefore enabling the system solver application 140 to obtain a fast and accurate convergence of the thermodynamic state solution. Without wishing to be bound by theory, it is thought that using the sensitivities determined by the flash solver application 130 to adapt one or more values determined by the flash solver application 130 based on trial solution values of pressure and flow instead of using the constant values determined by the flash solver application 130 contribute to the rapid and accurate convergence of the thermodynamic state solution.

In an embodiment, the network 210 may comprise a pressure flow network, the system solver application 140 may comprise a pressure flow solver, and a node 220 may comprise, for example, a vessel. The system solver application 140 may iteratively determine the pressure at each node and flows between nodes in the thermodynamic network 210. In an embodiment, the system solver application 140 may dither the values of a plurality of pressures and flows to arrive at a state solution. The system solver application 140 may further compute a residual associated with each node and compare a plurality of residuals to a stopping criterion to determine whether to terminate the iterations for the current time step. In an embodiment, the computation of a residual may involve the approximation of the rate of change with time of a primary thermodynamic variable X via a Taylor series expansion around the flash solution point, as shown in Eq. (3).

In an embodiment, the system solver application 140 may compute a volume residual R associated with a node, wherein $$R \text{ equals } (V_0 - V_{drum}) + \frac{dV}{dt}\Delta t,$$

wherein where $V_0$ is the volume of a fluid in a vessel associated with the node, wherein $V_0$ is calculated by a flash equilibrium calculation, where $V_{drum}$ is the volume of the vessel containing the fluid, where $$\frac{dV}{dt}$$

is the rate of change over time t of the volume of the fluid in the vessel, where V may be computed by the system solver application 140, and wherein $\Delta t$ indicates a time step, the time step determined by the thermodynamic process simulation application 120. In an embodiment, the volume residual R may comprise a damping factor $\lambda$ such as, for example, $$R = \lambda(V_0 - V_{drum}) + \frac{dV}{dt}\Delta t.$$

In an embodiment, λ ranges from 0 to 1.

In one embodiment, $$\frac{dV}{dt}$$

is estimated via the linear Taylor series $$\frac{dV}{dt} = \left(\frac{\partial V}{\partial P}\right)\frac{dP}{dt} + \left(\frac{\partial V}{\partial U}\right)\frac{dU}{dt} + \sum_i \left(\frac{\partial V}{\partial n_i}\right)\frac{dn_i}{dt},$$

wherein the index i may range from 1 to M, and wherein the series coefficients comprise a plurality of volume sensitivities evaluated at the flash solution point. The time derivatives $$\frac{n_i}{dt}, \frac{U}{dt}, \text{ and } \frac{dP}{dt}$$

may be obtained from the thermodynamic variables available during the iterations of the system solver application 140. In one embodiment, the time derivatives may be expressed as:

$$\frac{dn_i}{dt} = F^f x_i^f - F^v y_i - F^l x_i + r_i$$

$$\frac{dU}{dt} = \frac{1}{n}\left[\frac{d(nU)}{dt} - U\frac{dn}{dt}\right], \text{ wherein}$$

$$\frac{d(nU)}{dt} =$$

$$F^f H^f - F^v H^v - F^l H^l + Q_{imp} + Q_r \text{ and } \frac{dn}{dt} = F^f - F^v - F^l + \sum_i r_i$$

and $$\frac{dP}{dt} = \frac{P - P_0}{\Delta t},$$

wherein where $P_o$ is the pressure from the previous time step. The superscripts "f", "l" and "v" may indicate properties associated with the feed, the liquid phase or vapor phase, respectively. The subscript "imp" may indicate a value imposed externally, and the subscript "r" may indicate a value imposed due to a chemical reaction. In an embodiment, some of the products of time derivatives with corresponding sensitivities may be omitted from the calculation of the rate of change of volume, for example when these products are deemed negligible for the desired level of accuracy.

In every iteration, the system solver application 140 may compare a plurality of residuals, for example a plurality of volume residuals R based on $$(V_0 - V_{drum}) + \frac{dV}{dt}\Delta t,$$

to a stopping criterion to determine whether or not to proceed to the next iteration.

Different algorithms may be preferred for calculating the sensitivities, and it is contemplated that the teachings of the present disclosure may be applied to these different algorithms. In an embodiment, the sensitivities associated with the primary thermodynamic variable may be computed from the flash equilibrium solution by calculating for each of a plurality of nodes at least one partial derivative of the primary thermodynamic variable with respect to a secondary thermodynamic variable. In an embodiment, the sensitivities may be computed by establishing an equation of state for the thermodynamic system, keeping the secondary thermodynamic variables fixed, finding the flash equilibrium solution via calculating a differential of the equation of state and computing the sensitivities from the flash equilibrium solution via the partial derivatives of the primary thermodynamic variable with respect to the secondary thermodynamic variables, wherein the partial derivatives are evaluated at the flash solution point.

For example, in an embodiment, the equation of state may model the behavior of a vapor-liquid-liquid equilibrium (VLLE) state wherein Eq. (1) may comprise a system of equations, wherein the equations are solved simultaneously. In an embodiment, Eq. (1) may comprise a set of 3M+4 equations, wherein some of the equations may depend specifically on the chemical species. Eqs. (4)-(6) below are examples of equations for the i-th chemical species, and Eqs. (7)-(10) are species-independent. The subscripts '1' and '2' may be associated with the two liquid phases and the superscripts "l" and "v" may indicate properties associated with the liquid phase or vapor phase, respectively:

$$\frac{n_i}{n} = \alpha y_i + (1 - \alpha - \beta)x_{1i} + \beta x_{2i} \quad (4)$$

$$y_i \phi_i^v(T, P, y) = x_{1i}\phi_i^l(T, P, x_1) \quad (5)$$

$$y_i \phi_i^v(T, P, y) = x_{2i}\phi_i^l(T, P, x_2) \quad (6)$$

$$\sum_i y_i = \sum_i x_{1i} \quad (7)$$

$$\sum_i y_i = \sum_i x_{2i} \quad (8)$$

$$U = \alpha U^v(T, P, y) + (1 - \alpha - \beta)U^l(T, P, x_1) + \beta U^l(T, P, x_2) \quad (9)$$

$$v = \alpha v^v(T, P, y) + (1 - \alpha - \beta)v^l(T, P, x_1) + \beta v^l(T, P, x_2) \quad (10)$$

One skilled in the art may recognize that since i=1, 2, 3 . . . M, each of the equations Eq. (4), Eq. (5) and Eq. (6) comprises a set of M equations. Eq. (4) for a given species index i may indicate a mole balance between the two liquid phases. Eq. (5) and Eq. (6) for a given species index i may each indicate a phase equilibrium state for the liquids associated with the indices '1' and '2', respectively, and Eq. (7) and Eq. (9) may each indicate a mole fraction constraint for the liquids associated with the indices '1' and '2', respectively. Eq. (9) may indicate an energy balance and Eq. (10) may indicate a volume constraint.

The equation system comprising equations of type Eqs. (4)-(10) for a thermodynamic system may comprise the variables $\bar{n}, \alpha, \beta, \overline{x_1}, \overline{x_2}, y_i, U, V, T$ and $P$, i.e., a total of 4M+6 variables. On the other hand, the degrees of freedom of the equation system may be equal to (4M+6)−(3M+4)=M+2, i.e. larger than the number of equations. In an embodiment, the thermodynamic process simulation application 120 may determine the M+2 variables $n_i$, U and P to be the secondary thermodynamic variables, to satisfy the M+2 degrees of freedom.

In an embodiment, the differential of the equation system may be computed by differentiating Eqs. (4)-(10) and placing the fixed variables on the left side of each equation, which may be referred to in some contexts as implicit differentiation. Eqs. (11)-(17) below are resulting equations, each equation associated with species index i:

$$\frac{n dn_i - n_i \sum_{k \neq i} n_k}{n^2} = \alpha dy_i + (1 - \alpha - \beta)dx_{1i} + \beta dx_{2i} + (y_i - x_{1i})d\alpha + (x_{2i} - x_{1i})d\beta \tag{11}$$

$$\left(x_{1i}\frac{\partial \phi^l_{1i}}{\partial P} - y_i\frac{\partial \phi^v_i}{\partial P}\right)dP = y_i\left(\frac{\partial \phi^v_i}{\partial T}dT + \sum_{k \neq i}\frac{\partial(n\phi^v_i)}{\partial n_k}dy_k\right) + \tag{12}$$

$$\phi^v_i dy_i - x_{1i}\left(\frac{\partial \phi^l_{1i}}{\partial T}dT + \sum_{k \neq i}\frac{\partial(n\phi^l_{1i})}{\partial n_k}dx_{1k}\right) - \phi^l_{1i}dx_{1i}$$

$$\left(x_{2i}\frac{\partial \phi^l_{2i}}{\partial P} - y_i\frac{\partial \phi^v_i}{\partial P}\right)dP = y_i\left(\frac{\partial \phi^v_i}{\partial T}dT + \sum_{k \neq i}\frac{\partial(n\phi^v_i)}{\partial n_k}dy_k\right) + \tag{13}$$

$$\phi^v_i dy_i - x_{2i}\left(\frac{\partial \phi^l_{2i}}{\partial T}dT + \sum_{k \neq i}\frac{\partial(n\phi^l_{2i})}{\partial n_k}dx_{2k}\right) - \phi^l_{2i}dx$$

$$0 = \sum dy_i - \sum dx_{1i} \tag{14}$$

$$0 = \sum dy_i - \sum dx_{2i} \tag{15}$$

$$dU - \left(\alpha\frac{\partial U^v}{\partial P} + (1 - \alpha - \beta)\frac{\partial U^l_1}{\partial P} + \beta\frac{\partial U^l_2}{\partial P}\right)dP = \tag{16}$$

$$\alpha\left(\frac{\partial U^v}{\partial T}dT + \sum \frac{\partial(nU^v)}{\partial n_i}dy_i\right) +$$

$$(1 - \alpha - \beta)\left(\frac{\partial U^l_1}{\partial T}dT + \sum \frac{\partial(nU^l_1)}{\partial n_i}dx_{1i}\right) +$$

$$\beta\left(\frac{\partial U^l_2}{\partial T}dT + \sum \frac{\partial(nU^l_2)}{\partial n_i}dx_{2i}\right) + (U^v - U^l_1)d\alpha + (U^l_2 - U^l_1)d\beta$$

$$-\left(\alpha\frac{\partial v^v}{\partial P} + (1 - \alpha - \beta)\frac{\partial v^l_1}{\partial P} + \beta\frac{\partial v^l_2}{\partial P}\right)dP = \tag{17}$$

$$\alpha\left(\frac{\partial v^v}{\partial T}dT + \sum \frac{\partial(nv^v)}{\partial n_i}dy_i\right) +$$

$$(1 - \alpha - \beta)\left(\frac{\partial v^l_1}{\partial T}dT + \sum \frac{\partial(nv^l_1)}{\partial n_i}dx_{1i}\right) +$$

$$\beta\left(\frac{\partial v^l_2}{\partial T}dT + \sum \frac{\partial(nv^l_2)}{\partial n_i}dx_{2i}\right) + (v^v - v^l_1)d\alpha + (v^l_2 - v^l_1)d\beta - dv$$

The species index i in the summations comprised in Eqs. (11)-(17) may range from 1 to M, and the species index k in the summations comprised in Eqs. (11)-(13) may range from 1 to M, excluding i. In the same way that each of Eqs. (4)-(6) comprises a set of M equations, each of Eqs. (11)-(13) also comprises a set of M equations. The equation set comprising Eqs. (11)-(17) may form a linear equation set $A\vec{c} = \vec{b}$, wherein the matrix A may be associated with species index i, $\vec{b}$ may denote the left hand side of Eqs. (11)-(17), and $\vec{c}$ may denote the solution vector $\vec{c} = (dy_i, dx_{1i}, dx_{2i}, d\alpha, d\beta, dT, dv)$.

In an embodiment, the matrix A may comprise 7×7=49 sub-blocks, as shown in Eq. (18) below:

$$A = \begin{pmatrix} A_{1,1} & A_{1,2} & A_{1,3} & A_{1,4} & A_{1,5} & A_{1,6} & A_{1,7} \\ A_{2,1} & \ldots & \ldots & \ldots & \ldots & \ldots & \ldots \\ A_{3,1} & \ldots & \ldots & \ldots & \ldots & \ldots & \ldots \\ A_{4,1} & \ldots & \ldots & \ldots & \ldots & \ldots & \ldots \\ A_{5,1} & \ldots & \ldots & \ldots & \ldots & \ldots & \ldots \\ A_{6,1} & \ldots & \ldots & \ldots & \ldots & \ldots & \ldots \\ A_{7,1} & \ldots & \ldots & \ldots & \ldots & \ldots & A_{7,7} \end{pmatrix}, \tag{18}$$

wherein each of the sub-blocks $A_{1,1} \ldots A_{7,7}$ may comprise a row of elements, a column of elements, or a square matrix of elements. Blocks $A_{1,1}, A_{1,2}, A_{1,3}, A_{2,1}, A_{2,2}, A_{2,3}, A_{3,1}, A_{3,2}$ and $A_{3,3}$ may be of size M rows by M columns. Blocks $A_{1,4}$K $A_{1,7}$, $A_{2,4}$K $A_{2,7}$ and $A_{3,4}$K $A_{3,7}$ be of size M rows by 1 column. Blocks $A_{4,1}$K $A_{4,3}, A_{5,1}$K $A_{5,3}, A_{6,1}$ K $A_{6,3}$ and $A_{7,1}$K $A_{7,3}$ may be of size 1 row by M columns. All other sub-blocks may comprise one element only. The index i may label the rows in each sub-block. The index j may label the columns in each sub-block.

Using the Kronecker delta symbol $$\delta_{ij} = \begin{cases} 1, & \text{if } i = j \\ 0, & \text{if } i \neq j, \end{cases}$$

the (i,j)-th element of the sub-blocks $A_{1,1} \ldots A_{7,7}$ may have the following forms.

$A_{1,1}(i, j) = \alpha\delta_{ij}; A_{1,2}(i, j) = (1 - \alpha - \beta)\delta_{ij}; A_{1,3}(i, j) = \beta\delta_{ij};$ $A_{1,4}(i, 1) = y_i - x_{1i}; A_{1,5}(i, 1) = x_{2i} - x_{1i}; A_{1,6}(i, 1) = 0;$ $A_{1,7}(i, 1) = 0; A_{2,1}(i, j) = \phi^v_i\delta_{ij} + y_i\frac{\partial(n\phi^v_i)}{\partial n_j};$ $A_{2,2}(i, j) = -\phi^l_{1i}\delta_{ij} + x_{1i}\frac{\partial(n\phi^l_{1i})}{\partial n_j}; A_{2,3}(i, j) = 0; A_{2,4}(i, 1) = 0;$ $A_{2,5}(i, 1) = 0; A_{2,6}(i, 1) = y_i\frac{\partial(\phi^v_i)}{\partial T} - x_{1i}\frac{\partial(\phi^l_{1i})}{\partial T}; A_{2,7}(i, 1) = 0;$ $A_{3,1}(i, j) = \phi^v_i\delta_{ij} + y_i\frac{\partial(n\phi^v_i)}{\partial n_j}; A_{3,2}(i, j) = 0;$ $A_{3,3}(i, j) = -\phi^l_{2i}\delta_{ij} - x_{2i}\frac{\partial(n\phi^l_{2i})}{\partial n_j}; A_{3,4}(i, 1) = 0; A_{3,5}(i, 1) = 0;$ $A_{3,6}(i, 1) = y_i\frac{\partial(n\phi^v_i)}{\partial T} - x_{1i}\frac{\partial(n\phi^l_{2i})}{\partial T}; A_{3,7}(i, 1) = 0; A_{4,1}(1, j) = 1;$ $A_{4,2}(1, j) = -1; A_{4,3}(1, j) = 0; A_{4,4}(1, 1) = 0; A_{4,5}(1, 1) = 0;$ $A_{4,6}(1, 1) = 0; A_{4,7}(1, 1) = 0; A_{5,1}(1, j) = 1; A_{5,2}(1, j) = 0;$ $A_{5,3}(1, j) = -1; A_{5,4}(1, 1) = 0; A_{5,5}(1, 1) = 0; A_{5,6}(1, 1) = 0;$ $A_{5,7}(1, 1) = 0; A_{6,1}(1, j) = \alpha\frac{\partial(nU^v)}{\partial n_j};$ $A_{6,2}(1, j) = (1 - \alpha - \beta)\frac{\partial(nU^l_1)}{\partial n_j}; A_{6,3}(1, j) = \beta\frac{\partial(nU^l_2)}{\partial n_j};$ $A_{6,4}(1, 1) = U^v - U^l_1; A_{6,5}(1, 1) = U^l_2 - U^l_1;$ -continued $$A_{6,6}(1,1) = \alpha \frac{\partial(nU^v)}{\partial T} + (1-\alpha-\beta)\frac{\partial(U_1^l)}{\partial T} + \beta\frac{\partial(U_2^l)}{\partial T};$$

$$A_{6,7}(1,1) = 0; \quad A_{7,1}(1,j) = \alpha\frac{\partial(nv^v)}{\partial n_j};$$

$$A_{7,2}(1,j) = (1-\alpha-\beta)\frac{\partial(nv_1^l)}{\partial n_j}; \quad A_{7,3}(1,j) = \beta\frac{\partial(nv_2^l)}{\partial n_j};$$

$$A_{7,4}(1,1) = v^v - v_1^l; \quad A_{7,5}(1,1) = v_2^l - v_1^l;$$

$$A_{7,6}(1,1) = \alpha\frac{\partial(nv^v)}{\partial T} + (1-\alpha-\beta)\frac{\partial(v_1^l)}{\partial T} + \beta\frac{\partial(v_2^l)}{\partial T};$$

$$A_{7,7}(1,1) = -1.$$

The flash equilibrium solution may be found by solving Eqs. (4)-(10) simultaneously. The sensitivities may then be calculated from the flash equilibrium solution by solving for $\vec{c}$ via inverting A to yield $\vec{c} = A^{-1}\vec{b}$ or by an equivalent mathematical method. The sensitivities may thereby be calculated from the flash equilibrium solution via partial differentials by choosing different values of $\vec{b}$ for each partial derivative. In the example equations Eqs. (11)-(17), the values of the variables $n_i$, U and P are held fixed, and hence the sensitivities in this example may comprise partial derivatives with respect to $n_i$, U and P evaluated at the flash equilibrium solution point. To find the sensitivities with respect to $n_i$, the value of $dn_i$ may be set to 1 in $\vec{b}$, and the values of $dn_{k\neq i}$, dU and dP may be set to 0. Similarly, to compute the partial derivative with respect to U, the value of dU may be set to 1, and the values of $dn_i$ and dP may be set to 0.

In an embodiment, terms comprising mixed species indices i and k such as, for example, $$\sum_{k\neq i}\frac{\partial(n\phi_i^v)}{\partial n_k}dy_k, \quad \sum_{k\neq i}\frac{\partial(n\phi_{1i}^l)}{\partial n_k}dx_{1k}, \quad \sum_{k\neq i}\frac{\partial(n\phi_{2i}^l)}{\partial n_k}dx_{2k}$$

in equations Eqs. (12) and (13), may represent the influence of composition changes on the equilibrium values of the species and may be neglected. In that case, the number of columns in sub-blocks $A_{2,1}, A_{2,2}, A_{3,1}$ becomes 1 instead of M. This may reduce the size of A and thus dramatically speed up computations.

In an embodiment, the equation system for a vapor-liquid-water equilibrium (VLWE) state may be derived from Eqs. (4)-(10) by setting $x_{2i}=1$ if i=w and $x_{2i}=0$ if i≠w, wherein w is the species index associated with the water. As a result of this simplification, Eq. (8) vanishes.

In an embodiment, the equation system for a vapor-liquid equilibrium (VLE) state may be derived from Eqs. (4)-(10) by setting β to zero and dropping the subscripts '1' and '2'. As a result, Eqs. (5) and (6) merge into one equation, and Eqs. (7) and (8) merge into one equation. In a further embodiment, the equation system for a single phase equilibrium state may be derived from Eqs. (4), (9) and (10) by dropping terms containing variables associated with the phase that is not under consideration. For example, Eqs. (12)-(14) below are equations associated with species index i in liquid phase equilibrium, as derived from Eqs. (4), (9) and (10):

$$\frac{n_i}{n} = \alpha x_i \quad (19)$$

$$U = U^l(T, P, x) \quad (20)$$

$$v = v^l(T, P, x) \quad (21)$$

One skilled in the art will readily appreciate that the equations disclosed above may be adapted in a variety of ways while remaining faithful to the innovative concepts disclosed herein. In an embodiment, relationships represented as comprising equivalence may be implemented in some cases as proportional relationships. In some embodiments, one or more of the equations above may be adapted by adding in an offset.

Figure 3:
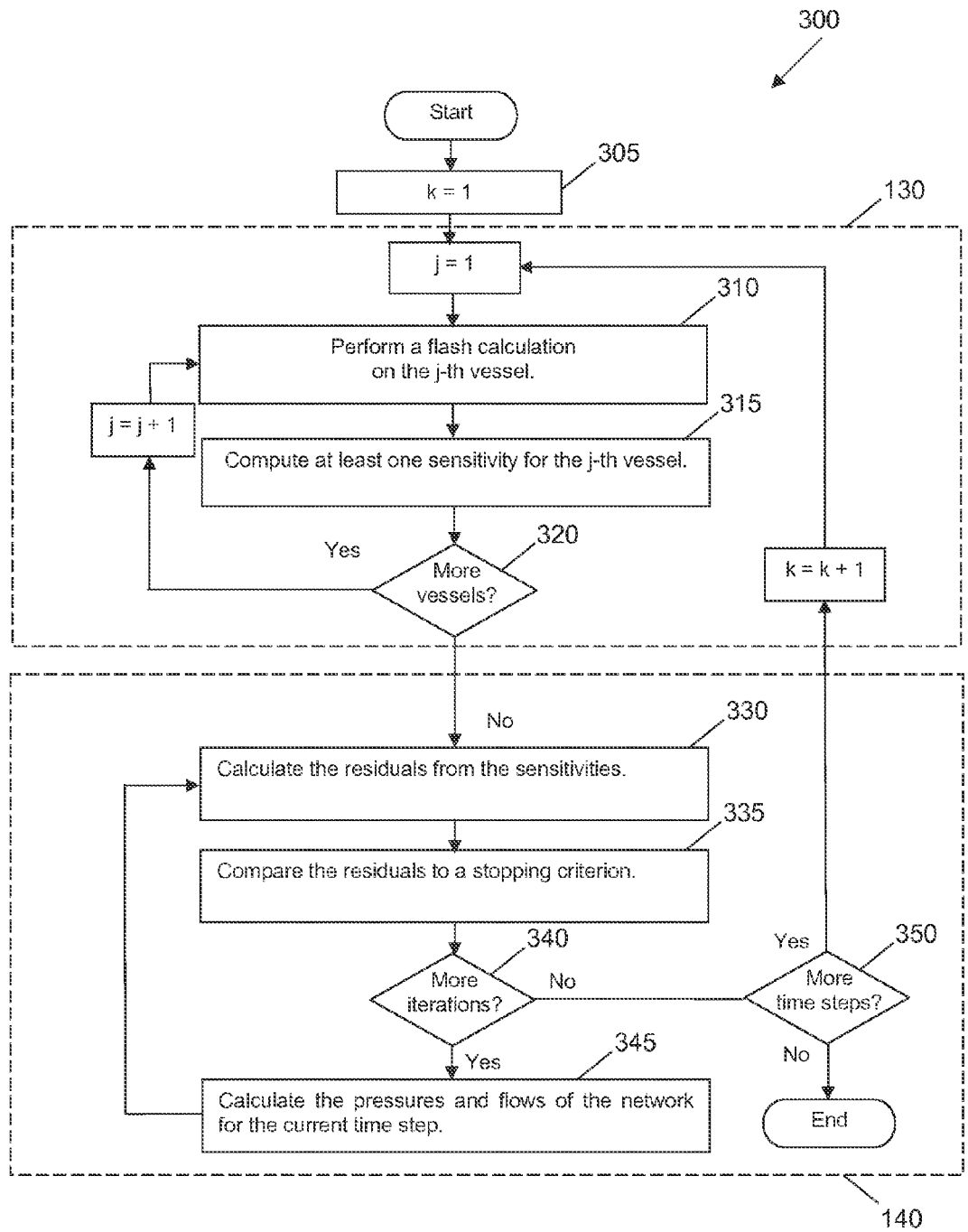
FIG. 3 illustrates a flow diagram of an embodiment of thermodynamic process simulation.

FIG. 3 illustrates a flow diagram of an embodiment of thermodynamic process simulation method 300 which may be used to implement the thermodynamic process simulator 120. Although the example in the figure illustrates the method 300 operating in a pressure flow network system, it is understood that the method 300 may be applied to different thermodynamic systems.

The method 300 may begin at block 305, where the method 300 may set a time step counter variable k to '1'. The method 300 may proceed to execute the flash solver application 130. The method 300 may set a vessel counter variable j to '1' and continue to block 310. At block 310, the method 300 may perform a flash calculation on the vessel associated with vessel counter variable j and proceed to block 315. At block 315, the method may compute at least one sensitivity for the vessel associated with vessel counter variable j and then continue to block 320, where the method 300 may determine whether there are more vessels in the network. If there are more vessels in the network, the method may increase the vessel counter variable j by one and continue to block 310, otherwise the method 300 may continue to block 330.

At block 330, the method 300 may calculate a plurality of residuals based on the sensitivities calculated from the flash solver application 130 and continue to block 335. At block 335, the method may compare the residuals to a stopping criterion. The stopping criterion may be determined considering constraints comprising computer speed, desired accuracy etc., as known to one skilled in the art. The method 300 may then proceed to block 340, where the method 300 may determine whether to perform more iterations. If the stopping criterion is not met, the method may continue to block 345. At block 345, the method 300 may calculate the values of the pressures and flows in the network 210 for the current time step and then proceed to block 330. If the stopping criterion is met, the method may continue to block 345. At block 350, the method may determine whether to add a new time step or whether to terminate the simulation. If the condition in block 350 is met, the method 300 may increase the time step counter variable k by one, set the vessel counter variable j to '1' and proceed to block 310. If the condition in block 350 is not met, the method 300 may end.

It is understood that the method 300 may execute in the loop from block 310 to block 315 to block 320 to block 330 to block 335 to block 340 to block 350 and thence back to block 310 for a plurality of iterations. While not explicitly illustrated as a processing block in FIG. 3, it is understood that in some embodiments, the method 300 may include taking some action based on one or more of the thermodynamic properties or other parameters determined by simulating the thermodynamic process. Alternatively, another method, not illustrated, may take action based on one or more of the thermodynamic properties or other parameters determined by simulating the thermodynamic process. Actions may include controlling a thermodynamic process control component, training an operator of the thermodynamic process control component, predicting a failure time of the thermodynamic process control component, optimizing the tuning of process control elements, validating a design for the thermodynamic process control component, controlling a chemical process control component, training an operator of the chemical process control component, predicting a failure time of the chemical process control component, optimizing the tuning of process control elements, validating a design for the chemical process control component, and other actions.

In an embodiment, portions of the system 100 described above may be provided as a computer program product. For example, in an embodiment, the thermodynamic process simulator application 120 and/or the flash solver application 130 and/or the system solver application 140 may be provided as a computer program product. In another embodiment, the thermodynamic process simulator application 120 and/or the flash solver application 130 and/or the system solver application 140 may be part of a thermodynamics modeling application (not shown) that may be provided as a computer program product. The computer program product may comprise one or more computer readable storage medium having computer usable program code embodied therein implementing the functionality of the thermodynamics modeling application, the thermodynamic process simulator application 120, and/or the flash solver application 130 and/or the system solver application 140. The computer program product may be embodied in removable computer storage media and/or non-removable computer storage media. The computer program product may be suitable for loading, by the computer 110, at least portions of the contents of the computer program product to secondary storage, non-volatile memory, and/or volatile memory of the computer 110. The computer program product may include data, data structures, files, executable instructions, and other information. A portion of the computer program product may comprise instructions that promote the loading and/or copying of data, data structures, files, and/or executable instructions to the secondary storage, the non-volatile memory, and/or volatile memory of the computer 110.

Figure 4:
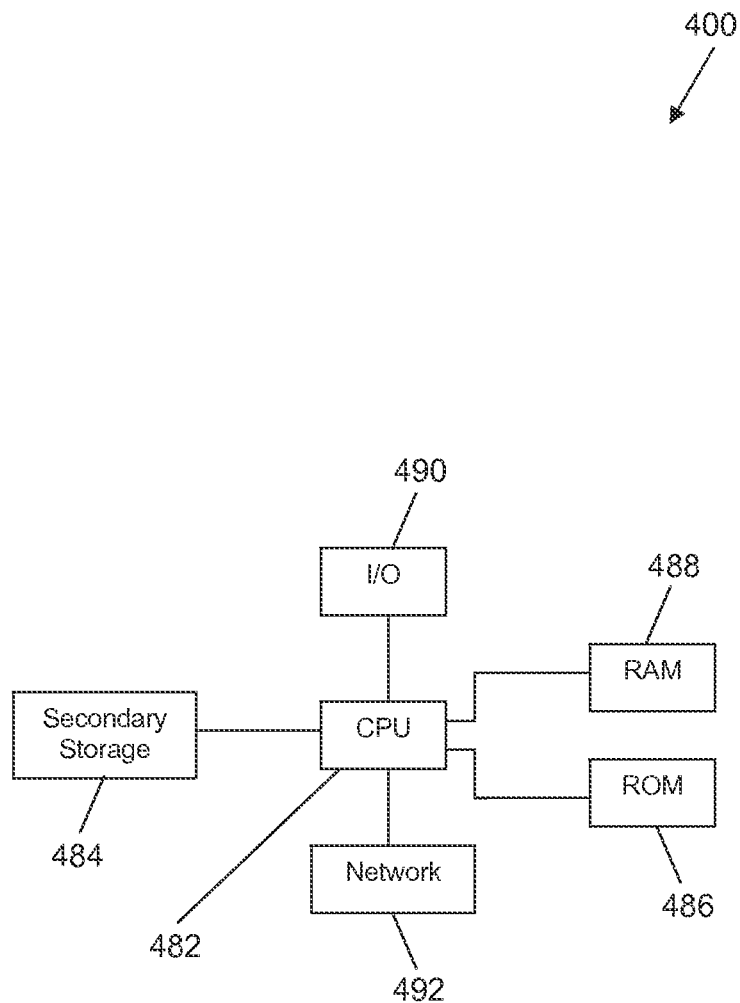
FIG. 4 is an illustration of a computer system according to an embodiment of the disclosure.

FIG. 4 illustrates a computer system 400 suitable for implementing the computer 110 described above. The computer system 400 includes a processor 482 (which may be referred to as a central processor unit or CPU) that is in communication with memory devices including secondary storage 484, read only memory (ROM) 486, random access memory (RAM) 488, input/output (I/O) devices 490, and network connectivity devices 492. The processor 482 may be implemented as one or more CPU chips.

It is understood that by programming and/or loading executable instructions onto the computer system 400, at least one of the CPU 482, the RAM 488, and the ROM 486 are changed, transforming the computer system 400 in part into a particular machine or apparatus having the novel functionality taught by the present disclosure. It is fundamental to the electrical engineering and software engineering arts that functionality that can be implemented by loading executable software into a computer can be converted to a hardware implementation by well known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an application specific integrated circuit (ASIC), because for large production runs the hardware implementation may be less expensive than the software implementation. Often a design may be developed and tested in a software form and later transformed, by well known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

The secondary storage 484 is typically comprised of one or more disk drives or tape drives and is used for non-volatile storage of data and as an over-flow data storage device if RAM 488 is not large enough to hold all working data. Secondary storage 484 may be used to store programs which are loaded into RAM 488 when such programs are selected for execution. The ROM 486 is used to store instructions and perhaps data which are read during program execution. ROM 486 is a non-volatile memory device which typically has a small memory capacity relative to the larger memory capacity of secondary storage 484. The RAM 488 is used to store volatile data and perhaps to store instructions. Access to both ROM 486 and RAM 488 is typically faster than to secondary storage 484. The secondary storage 484, the RAM 488, and/or the ROM 486 may be referred to in some contexts as computer readable storage media and/or non-transitory computer readable media.

I/O devices 490 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 492 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), long-term evolution (LTE), worldwide interoperability for microwave access (Wi-MAX), and/or other air interface protocol radio transceiver cards, and other well-known network devices. These network connectivity devices 492 may enable the processor 482 to communicate with the Internet or one or more intranets. With such a network connection, it is contemplated that the processor 482 might receive information from the network, or might output information to the network in the course of performing the above-described method steps. Such information, which is often represented as a sequence of instructions to be executed using processor 482, may be received from and outputted to the network, for example, in the form of a computer data signal embodied in a carrier wave.

Such information, which may include data or instructions to be executed using processor 482 for example, may be received from and outputted to the network, for example, in the form of a computer data baseband signal or signal embodied in a carrier wave. The baseband signal or signal embodied in the carrier wave generated by the network connectivity devices 492 may propagate in or on the surface of electrical conductors, in coaxial cables, in waveguides, in an optical conduit, for example an optical fiber, or in the air or free space. The information contained in the baseband signal or signal embedded in the carrier wave may be ordered according to different sequences, as may be desirable for either processing or generating the information or transmitting or receiving the information. The baseband signal or signal embedded in the carrier wave, or other types of signals currently used or hereafter developed, may be generated according to several methods well known to one skilled in the art. The baseband signal and/or signal embedded in the carrier wave may be referred to in some contexts as a transitory signal.

The processor 482 executes instructions, codes, computer programs, scripts which it accesses from hard disk, floppy disk, optical disk (these various disk based systems may all be considered secondary storage 484), ROM 486, RAM 488, or the network connectivity devices 492. While only one processor 482 is shown, multiple processors may be present. Thus, while instructions may be discussed as executed by a processor, the instructions may be executed simultaneously, serially, or otherwise executed by one or multiple processors. Instructions, codes, computer programs, scripts, and/or data that may be accessed from the secondary storage 484, for example, hard drives, floppy disks, optical disks, and/or other device, the ROM 486, and/or the RAM 488 may be referred to in some contexts as non-transitory instructions and/or non-transitory information.

In an embodiment, the computer system 400 may comprise two or more computers in communication with each other that collaborate to perform a task. For example, but not by way of limitation, an application may be partitioned in such a way as to permit concurrent and/or parallel processing of the instructions of the application. Alternatively, the data processed by the application may be partitioned in such a way as to permit concurrent and/or parallel processing of different portions of a data set by the two or more computers. In an embodiment, virtualization software may be employed by the computer system 400 to provide the functionality of a number of servers that is not directly bound to the number of computers in the computer system 400. For example, virtualization software may provide twenty virtual servers on four physical computers. In an embodiment, the functionality disclosed above may be provided by executing the application and/or applications in a cloud computing environment. Cloud computing may comprise providing computing services via a network connection using dynamically scalable computing resources. Cloud computing may be supported, at least in part, by virtualization software. A cloud computing environment may be established by an enterprise and/or may be hired on an as-needed basis from a third party provider. Some cloud computing environments may comprise cloud computing resources owned and operated by the enterprise as well as cloud computing resources hired and/or leased from a third party provider.

In an embodiment, some or all of the functionality disclosed above may be provided as a computer program product. The computer program product may comprise one or more computer readable storage medium having computer usable program code embodied therein to implement the functionality disclosed above. The computer program product may comprise data structures, executable instructions, and other computer usable program code. The computer program product may be embodied in removable computer storage media and/or non-removable computer storage media. The removable computer readable storage medium may comprise, without limitation, a paper tape, a magnetic tape, magnetic disk, an optical disk, a solid state memory chip, for example analog magnetic tape, compact disk read only memory (CD-ROM) disks, floppy disks, jump drives, digital cards, multimedia cards, and others. The computer program product may be suitable for loading, by the computer system 400, at least portions of the contents of the computer program product to the secondary storage 484, to the ROM 486, to the RAM 488, and/or to other non-volatile memory and volatile memory of the computer system 400. The processor 482 may process the executable instructions and/or data structures in part by directly accessing the computer program product, for example by reading from a CD-ROM disk inserted into a disk drive peripheral of the computer system 400. Alternatively, the processor 482 may process the executable instructions and/or data structures by remotely accessing the computer program product, for example by downloading the executable instructions and/or data structures from a remote server through the network connectivity devices 492. The computer program product may comprise instructions that promote the loading and/or copying of data, data structures, files, and/or executable instructions to the secondary storage 484, to the ROM 486, to the RAM 488, and/or to other non-volatile memory and volatile memory of the computer system 400.

In some contexts, a baseband signal and/or a signal embodied in a carrier wave may be referred to as a transitory signal. In some contexts, the secondary storage 484, the ROM 486, and the RAM 488 may be referred to as a non-transitory computer readable medium or a computer readable storage media. A dynamic RAM embodiment of the RAM 488, likewise, may be referred to as a non-transitory computer readable medium in that while the dynamic RAM receives electrical power and is operated in accordance with its design, for example during a period of time during which the computer system 400 is turned on and operational, the dynamic RAM stores information that is written to it. Similarly, the processor 482 may comprise an internal RAM, an internal ROM, a cache memory, and/or other internal non-transitory storage blocks, sections, or components that may be referred to in some contexts as non-transitory computer readable media or computer readable storage media.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intent is not to be limited to the details given herein. For example, the various elements or components may be combined or integrated in another system or certain features and formulas may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other examples of changes, substitutions, and alterations are ascertainable by one skilled in the art and could be made without departing from the spirit and scope disclosed herein.

What is claimed is:

1. A system, comprising:
   a computer system comprising at least one processor;
   a thermodynamic state solver application that, when executed by the at least one processor, computes a flash equilibrium state solution for each of a plurality of nodes in a thermodynamic network and determines for each of the plurality of nodes at least two sensitivities of a first thermodynamic property with reference to at least a second thermodynamic property and a third thermodynamic property, wherein a first sensitivity of the first thermodynamic property with reference to the second thermodynamic property is determined to be more significant than a second sensitivity of the first thermodynamic property with reference to the third thermodynamic property; and a thermodynamic system solver application that, when executed by the at least one processor, computes a thermodynamic state solution of the thermodynamic network based at least in part on an estimate of a thermodynamic property determined based on at least one of the sensitivities, wherein the estimate of the thermodynamic property determined based on the at least one of the sensitivities is computed by omitting consideration of the second sensitivity and the thermodynamic system solver application computes the thermodynamic system solution of the thermodynamic network based at least in part on the estimate, and wherein the system processes the thermodynamic state solution to execute at least one of controlling a thermodynamic process control component or controlling a chemical process control component.

2. The system of claim 1, wherein the estimate is computed based on a Taylor series expansion, and wherein the Taylor series coefficients comprise the at least one sensitivity.

3. The system of claim 2, wherein the Taylor series expansion comprises a first order Taylor series expansion.

4. The system of claim 1, wherein the thermodynamic state solver application executes separately for each of the plurality of nodes in the thermodynamic network.

5. The system of claim 1, wherein the thermodynamic system solver application determines a residual for each of the nodes, wherein the residual for a node is determined based on the at least one sensitivity associated with the node.

6. The system of claim 5, wherein the thermodynamic system solver compares stopping criteria to the residuals to determine when the thermodynamic state solution has been computed.

7. The system of claim 1, wherein each of the at least one sensitivities associated with a node comprises a partial derivative of the first thermodynamic variable with respect to one of the at least one second thermodynamic variable, where the partial derivative is evaluated at a solution point of the thermodynamic state solver application of the subject node.

8. The system of claim 7, wherein the partial derivative is evaluated at the flash equilibrium solution point of the subject node.

9. The system of claim 1, wherein the first thermodynamic property comprises a volume associated with each of the nodes.

10. The system of claim 9, wherein the at least one sensitivity comprises a first sensitivity of the volume of a node to changes in a pressure at the node.

11. The system of claim 9, wherein the at least one sensitivity comprises a second sensitivity of the volume of the node to changes in an internal energy at the node.

12. The system of claim 9, wherein the at least one sensitivity comprises a second sensitivity of the volume of the node to changes in a number of moles of a chemical species at the node.

13. A computer program product for a thermodynamic modeling system, the computer program product comprising:

a non-transitory computer readable storage medium having computer usable program code embodied therein; and the computer usable program code implementing a thermodynamic state solver application and a thermodynamic system solver application, wherein the thermodynamic state solver application, when executed by at least one processor, computes a flash equilibrium state solution for each of a plurality of nodes in a thermodynamic network and determines for each of the plurality of nodes at least two sensitivities of a first thermodynamic property with reference to at least a second thermodynamic property and a third thermodynamic property, wherein a first sensitivity of the first thermodynamic property with reference to the second thermodynamic property is determined to be more significant than a second sensitivity of the first thermodynamic property with reference to the third thermodynamic property, wherein the thermodynamic system solver application, when executed by the at least one processor, computes a thermodynamic system solution of the thermodynamic network based at least in part on an estimate of a thermodynamic property determined based on at least one of the sensitivities, wherein the estimate of the thermodynamic property determined based on the at least one of the sensitivities is computed by omitting consideration of the second sensitivity and the thermodynamic system solver application computes the thermodynamic system solution of the thermodynamic network based at least in part on the estimate, and wherein a result based on the thermodynamic system solution is determined by the computer usable program code and executed by the at least one processor, the result comprising at least one of controlling a thermodynamic process control component or controlling a chemical process control component.

14. The computer program product of claim 13, wherein the thermodynamic system solver application computes the thermodynamic system solution based at least in part on an approximation of a thermodynamic property associated with each node determined based at least in part on the at least one sensitivity associated with the node.

15. The computer program product of claim 13, wherein the thermodynamic system solver application determines a residual for each of the nodes, wherein the residual for a node is determined based at least in part on the at least one sensitivity associated with the node.

16. The system of claim 1, wherein the thermodynamic system solver application computes the thermodynamic system solution of the thermodynamic network based at least in part on an estimate of a thermodynamic property determined based on a linearization scheme.

17. The system of claim 1, wherein the thermodynamic system solver application computes the thermodynamic system solution of the thermodynamic network based at least in part on at least one thermodynamic property from the group consisting of a volume, an internal energy, a pressure, a molar flow, an enthalpy, a heat flow, a temperature, a molar volume, a vapor mole fraction, a second liquid mole fraction, a damping factor, and a fugacity coefficient.

* * * * *